United States Patent
Song et al.

(10) Patent No.: US 6,480,037 B1
(45) Date of Patent: Nov. 12, 2002

(54) SENSE AMPLIFIER CIRCUIT OF SEMICONDUCTOR MEMORY DEVICE

(75) Inventors: Tae-Joong Song, Suwon; Jin-Uok Lee, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/995,138

(22) Filed: Nov. 27, 2001

(30) Foreign Application Priority Data

May 31, 2001 (KR) .......................................... 2001-30442

(51) Int. Cl.$^7$ ................................................ G11C 7/06
(52) U.S. Cl. ............................................ 327/55; 327/57
(58) Field of Search ............................ 327/51–57, 307, 327/362; 365/203, 205, 207, 185.21, 189.05

(56) References Cited

U.S. PATENT DOCUMENTS

| | | | | |
|---|---|---|---|---|
| 5,854,562 A | * | 12/1998 | Toyoshima et al. ............ | 327/55 |
| 5,963,495 A | * | 10/1999 | Kumar ........................... | 327/57 |
| 6,008,673 A | * | 12/1999 | Glass et al. .................... | 327/55 |
| 6,147,514 A | * | 11/2000 | Shiratake ....................... | 327/55 |
| 6,310,501 B1 | * | 10/2001 | Yamashita ..................... | 327/55 |
| 6,396,309 B1 | * | 5/2002 | Zhao et al. .................... | 327/55 |

\* cited by examiner

*Primary Examiner*—Toan Tran
(74) *Attorney, Agent, or Firm*—F. Chau & Associates, LLP

(57) ABSTRACT

A CMOS cross-coupled sense amplifier circuit that detects and amplifies data of memory cells is disclosed. The sense amplifier having a favorable sense margin even if a mismatch occurs in transistors constructing the sense amplifier in the fabricating process. The sense amplifier includes voltage control transistors that control the voltage between drain and source of the NMOS transistors in the inverters connected in a latch type between output nodes at an identical phase during a pre-charge step and during an initial operation step. The channels of the voltage control transistors are connected between the drain and source of the NMOS transistors in the inverters for being controlled by a sense amplifier signal.

19 Claims, 3 Drawing Sheets

SENSE AMPLIFIER CIRCUIT OF SEMICONDUCTOR MEMORY DEVICE

BACKGROUND OF THE INVENTION

1. Field of the Invention

The present invention relates to a sense amplifier circuit of a semiconductor memory device, and more particularly to a CMOS cross-coupled sense amplifier circuit that detects and amplifies data of a memory cell.

2. Description of the Related Art

Due to technological trends in the field of semiconductors including, increased density, tighter design rules and lower supply voltages to drive memory devices, a sense amplifier that can detect and amplify voltage of memory cells has been developed to perform high speed operations but with low power consumption. A representative structure of a sense amplifier that performs high-speed operations but consumes low power is a cross-coupled device. Cross-coupled sense amplifiers have been successfully utilized to detect and amplify the voltage of memory cells in a static RAM (SRAM). The structure of such a CMOS cross-coupled sense amplifier is illustrated in FIG. 1.

FIG. 1 is an illustration of a prior art CMOS cross-coupled sense amplifier.

FIG. 2 is a graph showing currents between drain and source (Ids) according to voltage between drain and source (Vds) and voltage between gate and source (Vgs) in a conventional N-type MOS transistor. Plots shown with a solid line and a dotted line designate the current Ids for a drain and source, respectively, in a transistor whose threshold voltage mismatches are indicated as −ΔV and +ΔV, respectively.

Now, operations of the prior art CMOS cross-coupled sense amplifier circuit will be briefly described with reference to FIGS. 1 and 2.

As shown in FIG. 1, the CMOS cross-coupled sense amplifier circuit includes a PMOS transistor 12 and an NMOS transistor 14 connected in a series between supply voltage Vdd and a first internal node IN1. The gates of PMOS transistor 12 and NMOS transistor 14 are connected to a second output node ON2 for inverting a signal input to the gates outputting the signal to a first output node ON1. PMOS transistor 16 and NMOS transistor 18 are connected in series between supply voltage Vdd and a second internal node IN2. The gates of PMOS transistor 16 and NMOS transistor 18 are connected to a first output node ON1 for inverting a signal input to the gates and outputting the signal to a second output node ON2. A first equalization transistor 20 is connected between the first and second internal nodes, IN1 and IN2, for equalizing electric potential of the internal nodes, IN1 and IN2 in response to a control signal, CS. The control signal, CS, is input from outside at a pre-charged level. A first input transistor 22 is connected between a pull-down node PN and the first internal node IN1 for inputting voltage of a bit line BL to a gate. A second input transistor is connected between the pull-down node PN and the second internal node IN2 for inputting voltage of a bit line BLB to its gate. A driving transistor 26 is connected between the pull-down node PN and ground for pulling down the electric potential of the pull-down node PN to a ground level in response to a control signal, CS, input to its gate is at a driving level. BLB is the complement bit line of bit line BL.

Reference numerals 28 and 30 are pre-charge transistors connected between supply voltage Vdd and the first output node ON1, and between supply voltage Vdd and the second output node ON2, respectively. The pre-charge transistors 28 and 30 pre-charge the first and second output nodes ON1 and ON2 to the level of supply voltage, Vdd, by switching when the control signal, CS, input to gates of the transistors is at the pre-charge level. In addition, reference numeral 32 is a second equalization transistor. The second equalization transistor 32 equalizes the electric potential of the two output nodes ON1 and ON2, in response to an input of a pre-charged level of a control signal CS. As shown in FIG. 1, the first and second input transistors 22 and 24, and the driving transistor 26 are NMOS transistors. The first and second equalization transistors 20 and 32, and pre-charge transistors 28 and 30 are PMOS transistors.

Operations of the CMOS cross-coupled sense amplifier circuit thus constructed will be described briefly. A control signal, CS, to drive the sense amplifier, maintains an initial low level of logic but turns into a "high" level of logic for a predetermined period of time when a semiconductor memory device is activated. For example, when a low address strobe signal is activated to allow data input and output to memory cells (not shown). Accordingly, if the control signal, CS, is low and input at the pre-charge level, the pre-charge transistors 28 and 30, and the first and second equalization transistors, 20 and 26, are all "turned on". At the pre-charge mode as such, the first and second output nodes, ON1 and ON2, are pre-charged to the level of supply voltage, "Vdd", and, equalized by the second equalization transistor to get ready to detect and amplify the electric potential of bit lines BL/BLB. The electric potential of the first and second internal nodes, IN1 and IN2, is equalized by turning on the first equalization transistor 20. After completion of pre-charge and equalization operations, bit lines, BL and BLB, are to be maintained at the same electric potential.

After a memory cell (not shown) is selected to develop its electric potential, it is transferred to bit lines BL and BLB, connected to the related memory cell and provided to the NMOS transistors 22 and 24. At this time, when the control signal, CS, is activated to its high level from its low level of logic, the sense amplifier, shown in FIG. 1, is driven. The pre-charge transistors 28 and 30, and the first and second equalization transistors, 20 and 32, are turned off, and the driving transistor 26 is turned on to pull down the electric potential of the pull-down node PN to ground. If the driving transistor 26 is turned on, the sense amplifier circuit, shown in FIG. 1, amplifies a voltage difference developed in the electric potential from the memory cell and outputs it to the first and second output nodes, ON1 and ON2.

For example, if a voltage offset loaded at bit lines BL and BLB, exceeds a predetermined level of voltage, e.g., if the voltage offset of the bit lines BL and BLB develop into (+)/(−), the voltage of the first and second internal nodes, IN1 and IN2, increases in different directions by operations of the first and second input transistors, 22 and 24. The voltage of the first and second internal nodes, IN1 and IN2, is amplified by the four transistors 12, 13, 14 and 16, connected in the latch type between the first and second internal nodes, IN1 and IN2, and then, output to the first and second output nodes, ON1 and ON2, as levels of logic, "low, high" or "high, low".

The conventional sense amplifier circuit shown in FIG. 1 performs its normal operations if the voltage offset of bit lines BL and BLB become greater than a predetermined level, but does not perform its normal operations if the voltage offset of bit lines BL and BLB becomes smaller than a predetermined level. A minimum voltage offset of the bit lines BL and BLB that can operate the sense amplifier circuit is defined as a voltage margin of a sense amplifier. As the minimum voltage offset as such becomes smaller, the sense margin of a sense amplifier is considered favorable. As the minimum voltage offset becomes greater, the sense margin of a sense amplifier is considered poor.

However, the sense amplifier shown in FIG. 1 has a large number of inter-related transistors, so it may not operate with an input level of voltage offset because of a mismatch among transistors. The mismatch includes a mismatch in the thickness or length of channels, in capacitance or in threshold voltage, thereby transistors behave differently with variations in the manufacturing process. In other words, a sense amplifier may have a worse sense margin than another type of a sense amplifier. If a mismatch that occurred in the manufacturing processes results in a mismatch in the threshold voltage of transistors in the sense amplifier constructed as shown in FIG. 1. The voltage margin between bit lines BL and BLB should be sufficiently great, e.g., greater level of voltage than usual.

Therefore, if the sense amplifier circuit shown in FIG. 1 does not have a sufficiently great voltage margin between bit lines BL and BLB, it may falsely operate or may not operate due to a mismatch in transistors.

The aforementioned problem will be described in more detail. There may be false operations due to a mismatch that occurred in transistors forming a CMOS cross-coupled sense amplifier. For example, if no mismatch of transistors occurs under the supposed conditions that the voltage levels of bit lines BL and BLB are V+ΔV and V−ΔV and the voltage offset of the bit lines BL and BLB is a positive (+) voltage, the sense amplifier, shown in FIG. 1, will perform normal operations. Thus, the level of voltage. Further, "0V" will be output to the first output node ON1 and Vdd will be supplied to the second output node ON2.

However, supposing that there is a severe mismatch of transistors forming the sense amplifier shown in FIG. 1, the sense amplifier shown in FIG. 1 cannot generate a correct amplifying signal. The level of voltage at the first output node ON1 becomes the supply voltage Vdd, and of the voltage at the second output node ON2 becomes "0V". Even if there may be a variety of reasons causing the mismatch of transistors as described above, we will illustrate the mismatch problem by describing one that occurred in the fabricating processes for convenience.

In the sense amplifier shown in FIG. 1, the absolute value of the threshold voltage at the PMOS transistor 16 and NMOS transistors 14 and 22 should be raised by ΔVth to prevent the output voltage at the first output node ON1 from being "0". The absolute value of the threshold voltage at the PMOS transistor 12 and NMOS transistors 18, 24 should be lowered by ΔVth to prevent the output voltage of the second output node ON2 from becoming "Vdd".

If a mismatch in the threshold voltage of transistors is caused by problems related to the fabricating processes, an undesired level of output voltage may be obtained. Due to the above-mentioned mismatch in the threshold voltage of the transistors, if the difference in the input voltage of the sense amplifier shown in FIG. 1, e.g., the voltage offset of 2 ΔVth, is not large enough to overcome mismatches in voltage between the first and second internal nodes, IN1 and IN2, and between the first and second output nodes, ON1 and ON2, an undesired level of voltage of output voltage is obtained. The mismatches in voltage between the first and second internal nodes, IN1 and IN2, and between the first and second output nodes, ON1 and ON2, may be caused by current Ids between drain and source of the NMOS transistor 14 or 18. The phases of an output voltage are "Vdd" and "0" at the first and second output nodes, ON1 and ON2, respectively. A further detailed description will be made about it below.

In case of transistors having voltage Vgs between gate and source and voltage Vds between drain and source, the current Ids of the NMOS transistor having (+)ΔVth becomes greater than that of the NMOS transistor having (−)ΔVth. As shown in FIG. 2, in case of transistors having identical Vds, Vgs, there becomes a difference in the current Ids between drain and source by ΔIds due to (−)ΔVth and (+)ΔVth.

If the aforementioned concept can be applied to the transistors at an initial operational stage of the sense amplifier, the following description can be made about a worst mismatch in the CMOS cross-coupled sense amplifier shown FIG. 1. The threshold voltage of the NMOS transistor 22 that inputs voltage of the bit line BL to the gate is greater than that of the NMOS transistor 24, which inputs voltage of the bit line BLB to the gate, so that the current Ids of the NMOS transistor 24 becomes greater than that of the NMOS transistor 22. Further, as the threshold voltage of the NMOS transistor 14 becomes greater than that of the NMOS transistor 18 in CMOS latch, the current Ids of the NMOS transistor 18 becomes greater than that of the NMOS transistor 14. The voltage Vds between drain and source and the voltage Vgs between gate and source of the PMOS transistors 12 and 16, are very close to "0V", so that there may be no difference in the current Ids of the two PMOS transistors 12 and 16.

As described above, the current Ids of respective transistors flows in undesired directions due to a mismatch in the threshold voltage of the transistors forming the sense amplifier shown in FIG. 1.

Therefore, a need exists for a sense amplifier having a minimum voltage offset greater than when there is no mismatch.

SUMMARY OF THE INVENTION

It is an object of the present invention to provide a sense amplifier circuit that efficiently senses and amplifies the level of an electric potential developed signal even if a mismatch occurs in transistors.

It is another object of the present invention to provide a structure of a CMOS cross-coupled sense amplifier circuit having a superior sense margin.

It is a further another object of the present invention to provide a structure of a cross-coupled sense amplifier circuit that detects and amplifies the electric potential of bit lines having a superior sense margin even if a mismatch occurs in transistors of a chip due to conditions of fabricating processes.

In order to accomplish the aforementioned object of the present invention, there is provided a sense amplifier circuit comprising:
 a first inverter having PMOS and NMOS transistors with respective drains being connected to a first output node and respective sources being connected to a supply voltage, and a first node connected to respective gates commonly connected to a second output node;
 a second inverter having PMOS and NMOS transistors with respective drains being connected to a second output node and respective sources being connected to supply voltage, and a second node connected to respective gates commonly connected to a first output node;
 first and second input transistors, with respective channels connected between the first node and a pull-down node and between the second node and the pull-down node, respectively, for pulling the first and second nodes to an electric potential of the pull-down node according to an electric potential of a bit line and complement bit line connected to respective gates of the first and second input transistors;

a driving transistor for pulling down the pull-down node to ground in response to activation of a predetermined level of a control signal; and mismatch control transistors respectively connected between the drain and source of the NMOS transistors in the first and second inverters, for eliminating differences in voltage between the first output node and the first node, and between the second output node and the second node, in response to non-activation of the control signal.

It is preferable that the sense amplifier circuit of the present invention has an equalization transistor between the first and second nodes for equalizing the electric potential of the first and second nodes in response to non-activation of the control signal.

It is also preferable that the sense amplifier circuit has pre-charge transistors for pre-charging the potential of the first and second output nodes to a level of supply voltage in response to non-activation of the control signal.

Also, the sense amplifier circuit includes a second equalization transistor connected between the first and second output nodes for equalizing the electric potential of the first and second output nodes to an identical level thereof in response to non-activation of the control signal.

According to an embodiment of the present invention, a method is provided for compensating for a difference between two or more like transistors of a sense amplifier. The method includes equalizing the electric potential between a first node and a second node in response to non-activation of a control signal, wherein at least a first equalization transistor is connected between the first and the second nodes. The method further includes pre-charging the electric potential of a first output node and a second output node to a level of supply voltage in response to non-activation of the control signal, wherein a first and a second pre-charge transistors are implemented with the control signal input at the respective pre-charge transistor gates. The method equalizes the electric potential of the first output node and the second output node in response to non-activation of the control signal, wherein at least a second equalization transistor is connected between the first and the second output nodes.

The method further includes equalizing the electric potential of the first node and the second node in response to the control signal at a pre-charge level.

The method pre-charges the electric potential of the first output node and the second output node to a level of a supply voltage in response to the control signal at a pre-charge level.

The method also equalizes the electric potential of the first output node and the second output node in response to the control signal at a pre-charge level.

The difference can be one or more of a difference in thickness of channels, in length of channels, in capacitance, and in threshold.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF PREFERRED EMBODIMENTS

Figure 1:
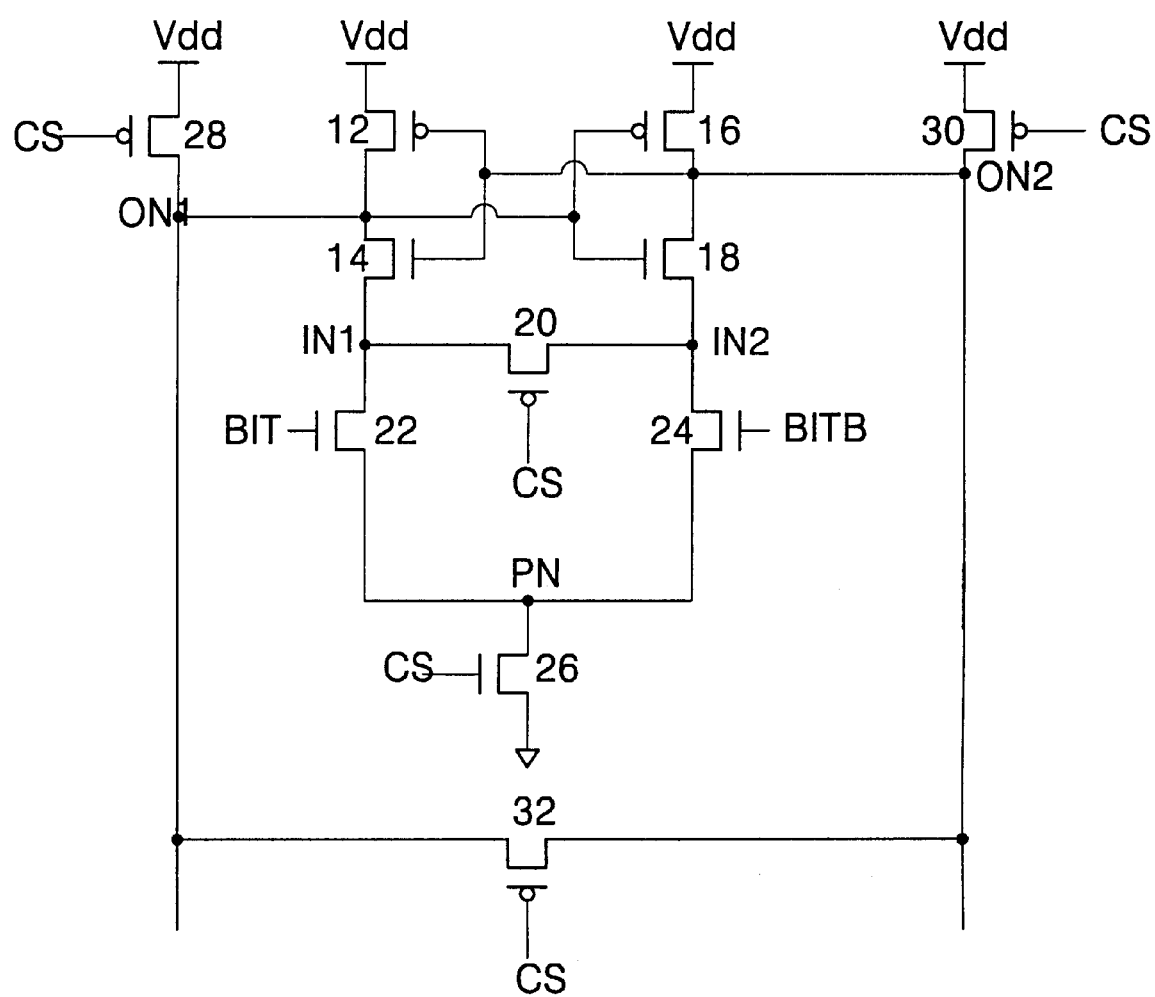
FIG. 1 is an illustration of a CMOS cross-coupled sense amplifier in accordance with the prior art.

Hereinafter, preferred embodiments of the present invention will be described in detail with reference to accompanying drawings. Like reference numerals shown in FIG. 1 will be used for designation of like or equivalent parts or portions shown in FIG. 3 for simplicity of illustration and explanation.

Figure 3:
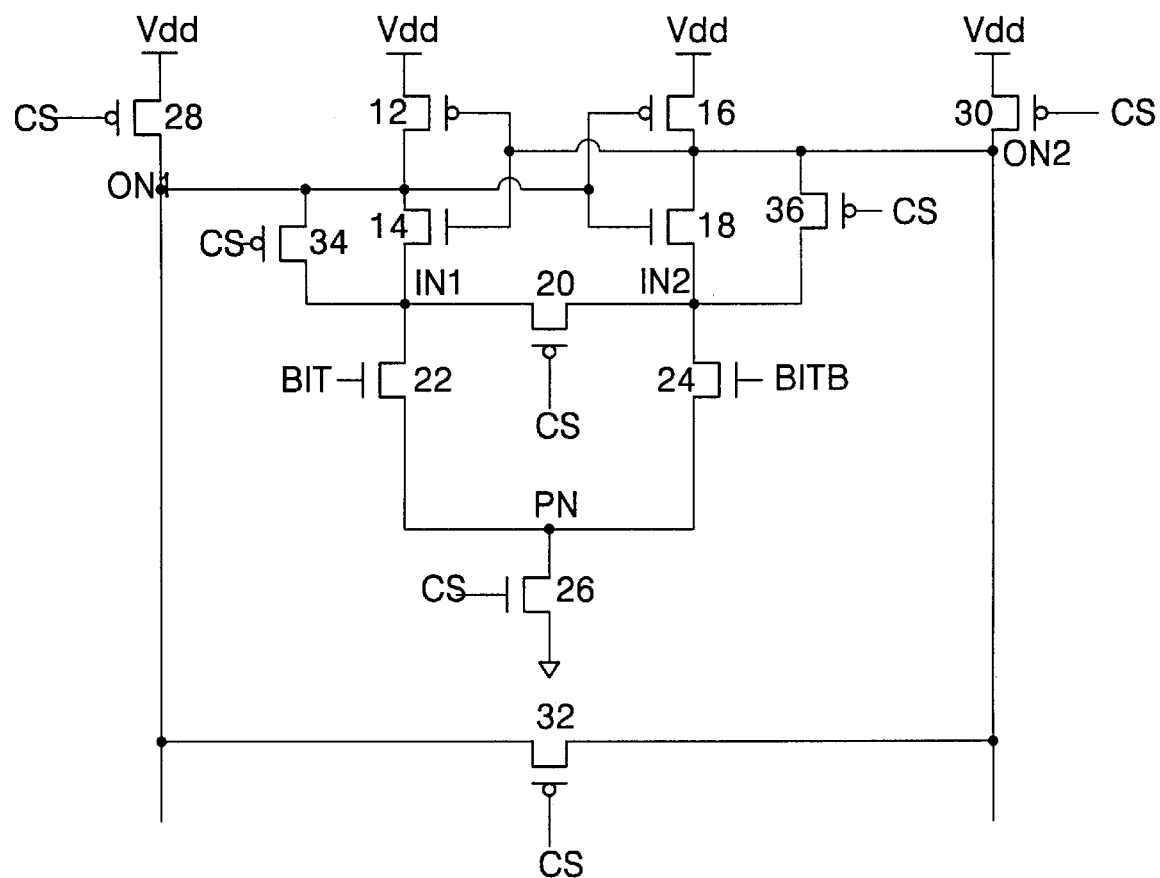
FIG. 3 is an illustration of a CMOS cross-coupled sense amplifying circuit in accordance with an embodiment of the present invention.

FIG. 3 illustrates a structure of a CMOS cross-coupled sense amplifier circuit in accordance with a preferred embodiment of the present invention. As shown in FIG. 3, in addition to all parts shown in FIG.1, respective channels are connected between the first output node ON1 and the first internal node IN1, and between the second output node ON2 and the second internal node IN2. A first equalization control transistor 34 is driven to equalize and remove the differences in voltage between the first output node ON1 and the first internal node IN1 when the control signal CS input to the gate of equalization control transistor 34 is at a pre-charge mode. A second equalization control transistor 36 is driven to equalize and remove the differences in voltage between the second output node ON2 and the second internal node IN2 when the control signal CS input to the gate of equalization control transistor 36 is at a pre-charge mode. The source and drain of the first and second equalization control transistors 34 and 36 are between the drain and source of the NMOS transistors 14 and 18, respectively, forming a latch between the first and second output nodes, ON1 and ON2.

According to a preferred embodiment of the present invention, equalization control transistors 34 and 36 are substantially the same as the pre-charge transistors. For example, PMOS transistors are used for being turned on at the pre-charge mode.

Prior to a detailed description of the operations of the CMOS cross-coupled sense amplifier circuit shown in FIG. 3 in accordance with a preferred embodiment of the present invention, a supposition should be made that a mismatch occurred in threshold voltage of transistors constructing the sense amplifier circuit as in FIG. 1.

Now, if a control signal CS input to the CMOS cross-coupled sense amplifier circuit shown in FIG. 3 is at a pre-charge level of "low", the pre-charge transistors 28 and 30, the first and second equalization transistors 20 and 32, and equalization control transistors 34, 36 are all turned on for inputting control signal CS into their gates. Also, the driving transistor 26 that inputs the control signal CS is turned off, thereby disabling the sense amplifier. As a result, if the control signal CS is input at its pre-charge level, the NMOS transistor 26 is turned off to shut down a current path, and the equalization transistor 20 is turned on. Therefore, the sources of the NMOS transistors 14 and 18 are of the same level.

Thus, as the equalization control transistors 32 and 34 are turned on by the aforementioned operations, it becomes possible to maintain the voltage at the first output node ON1 and the first internal node IN1, and at the second output node ON2 and the second internal node IN2. For example, the voltage can be maintained at the level of "high". While the control signal CS is at its transition from "low" to "high", the voltage is maintained by the voltage input to the gates of the first and second equalization control transistors 34 and 36 even if the absolute value of the voltage Vgs between gate and source is smaller than that of the threshold voltage of the corresponding transistors.

In response to an input of a "low" level of the control signal CS, the first equalization control transistor 34 eliminates or substantially reduces the difference of voltage Vds between the first output node ON1 and the first internal node IN1. That is, between the drain and source of the NMOS transistor 14. The difference of voltage Vgs between the second output node ON2 and the first internal node IN1 is also eliminated or substantially reduced. That is, between the gate and source of the NMOS transistor 14. In response to an input of a "low" level of the control signal CS, the second equalization control transistor 36 eliminates or substantially reduces the difference of voltage Vds between the second output node ON2 and the second internal node IN2. That is, between the drain and source of the NMOS transistor 18. The difference of voltage Vgs between the first output node ON1 and the second internal node IN2 is also eliminated or substantially reduced. That is, between the gate and source of the NMOS transistor 18 in the second inverter 40. Therefore, operations of the first and second equalization control transistors 34 and 36 to be turned on for pre-charge substantially reduces or eliminate Vds and Vgs of the NMOS transistors. Therefore, it can be possible to reduce the difference ΔIds of the current Ids between the drain and source of respective NMOS transistors 14 and 18 generated by a mismatch in threshold voltage Vth.

Figure 2:
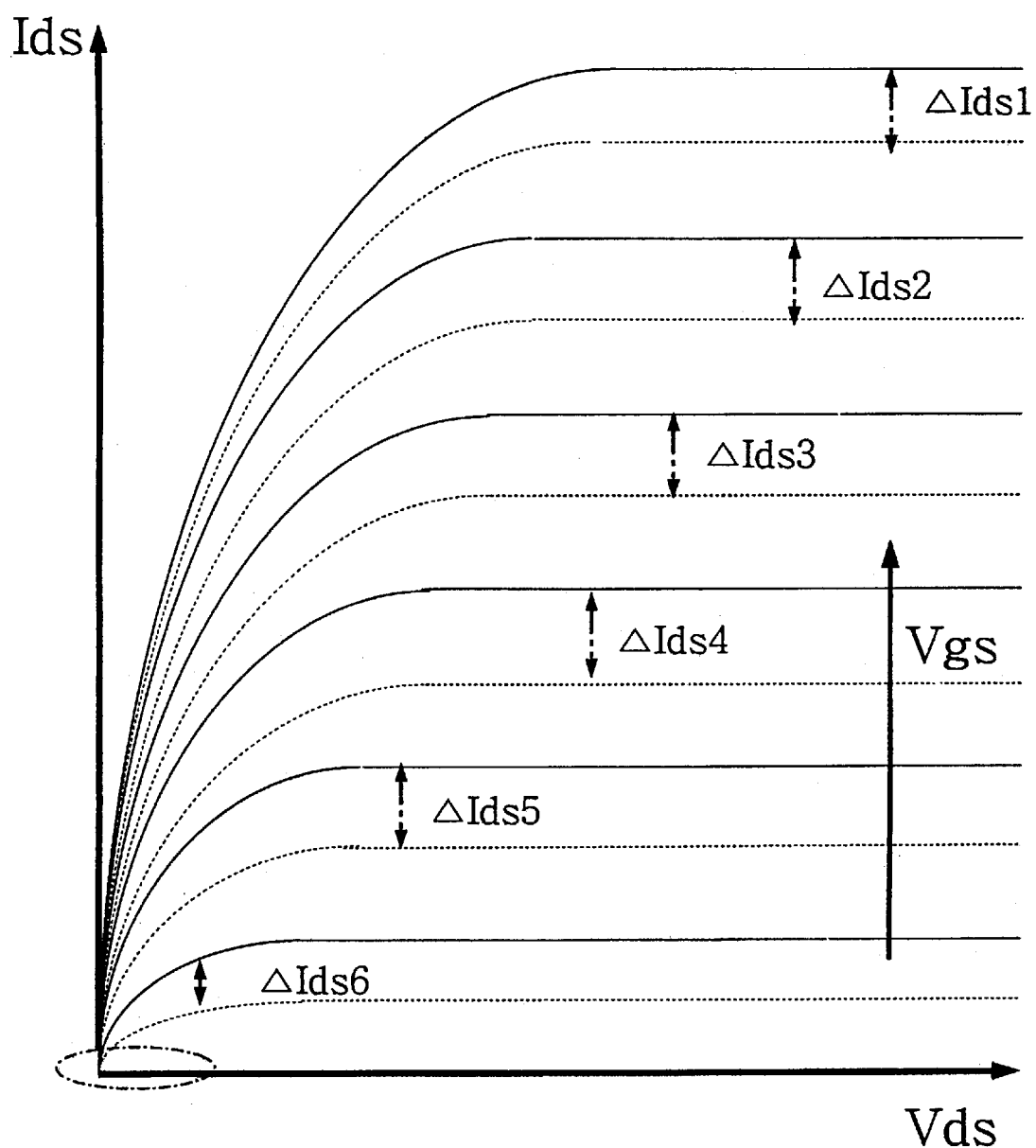
FIG. 2 is a graph of current Ids between drain and source according to voltage Vds between drain and source and voltage Vgs between gate and source of general N-type MOS transistor.

If the direct current, DC, feature of the NMOS transistors shown in FIG. 2 is considered, it can be understood that the range of drain current Ids flowing toward the source from the drain becomes smaller as the values of voltage Vds between the drain and source and the value of voltage Vgs between the gate and source become smaller. When the range of the drain current Ids of the NMOS transistors 14 and 18 becomes smaller by the aforementioned operations, the difference ΔIds between the drain current Ids of the NMOS transistors 14 and 18 generated by the mismatch of the threshold voltage, caused by problems in the fabricating processes, also becomes very small. ΔIds is the difference of Ids generated by a mismatch in the threshold voltage of two transistors neighboring the voltage Vds between the drain and source of transistors and the voltage Vgs between the gate and source.

Since the range of the drain current Ids becomes small with the reduction in the voltage Vgs between the drain and source, and the reduction in the voltage between the gate and source Vds of the NMOS transistors 14 and 18 as shown in FIG. 2, it can be seen that the ΔIds gradually becomes smaller from ΔIds1 to ΔIds6. As described above, the first and second equalization control transistors, 34 and 36 are turned on to reduce the difference of the current Ids between the drain and source. The difference may be generated by a mismatch in the threshold voltage of the NMOS transistors 14 and 18, thereby reducing the difference in voltage of the first internal node IN1 and the second internal node IN2.

If the control signal, CS, to drive the sense amplifier circuit turns from "low" to "high" with the voltage offset between the first and second internal nodes IN1 and IN2 being reduced, the pre-charge transistors 28 and 30, the equalization transistors 20 and 32 and the first and second equalization control transistors 34 and 36 are all turned off. Capacitance between the gate and source, and the capacitance between the gate and drain of the first and second equalization control transistors, 34 and 36, raise the level of voltage at the source and drain nodes thereof. The source and drain of the first equalization control transistor 34 are connected to the first output node ON1 and the first internal node IN1 respectively. The second output node ON2 and the second internal node IN2 are connected to the source and drain of the second equalization control transistor 36 respectively. Therefore, equally increasing the level of voltage at the drain and source of the NMOS transistors, 14 and 18, to prevent any influence.

As described above, if the voltage offset in the first and second internal nodes IN1, IN2 is reduced by the control of the first and second equalization control transistors, 34 and 36, the voltage offset caused by a mismatch should also be reduced. As a result, the sense amplifier circuit illustrated in FIG. 3 is normally operated even with an input of small voltage offset, thereby making it possible to predict a good sense margin.

There is an advantage in the CMOS cross-coupled sense amplifier circuit of the present invention in that a good sense margin of the sense amplifier is obtained in spite of an a mismatch in the characteristics of the transistors. According to an embodiment of the present invention, the level of voltage at the drain and source of the NMOS transistors constructing a latch can be held at a substantially identical electric potential of voltage during the pre-charge step and during the initial operation.

Having described embodiments for a CMOS cross-coupled sense amplifier circuit that detects and amplifies data of memory cells, it is noted that modifications and variations can be made by persons skilled in the art in light of the above teachings. It is therefore to be understood that changes may be made in the particular embodiments of the invention discloses which are within the scope and spirit of the invention as defined by the appended claims. Having thus described the invention with the details and particularity required by the patent laws, what is claimed and desired protected by Letter Patent is set forth in the appended claims.

What is claimed is:

1. A sense amplifier circuit of a semiconductor memory device comprising:

first and second output nodes for outputting a detected and amplified signal;

a latch having first and second inverters cross-coupled between the first and second output nodes;

first and second input transistors having drains connected to drains of NMOS transistors in the first and second inverters respectively, for inputting, at respective gates, a bit line and a complement bit line;

a driving transistor, connected between a common pull-down node of the first and second input transistors and ground for pulling down an electric potential of the pull-down node to the level of ground in response to activation of a control signal; and voltage control transistors, connected between the drain and source of the NMOS transistors in the first and second inverters, respectively, for maintaining a voltage at the drain and source of the NMOS transistors in the first and second inverters at a substantially identical level in response to the control signal shifting from its pre-charge level to its activation level.

2. A sense amplifier circuit of a semiconductor memory device comprising:

a first inverter having PMOS and NMOS transistors with respective drains being connected to a first output node and respective sources being connected to supply voltage, and a second node connected to respective gates commonly connected to a second output node;

a second inverter having PMOS and NMOS transistors with respective drains being connected to a second output node and respective sources being connected to supply voltage, and a second node connected to respective gates commonly connected to a first output node;

first and second input transistors, with respective channels connected between the first node and a pull-down node and between the second node and the pull-down node, respectively, for pulling the first and second nodes to an electric potential of the pull-down node according to an electric potential of a bit line and a complement bit line connected to respective gates of the first and second input transistors;

a driving transistor for pulling down the pull-down node to ground in response to activation of a predetermined level of a control signal; and mismatch control transistors respectively connected between the drain and source of the NMOS transistors in the first and second inverters, for eliminating differences in voltage between the first output node and the first node, and between the second output node and the second node, in response to non-activation of the control signal.

3. The circuit of claim 2, further comprising a first equalization transistor installed between the first and second nodes for equalizing the electric potential of the first and second nodes in response to the control signal at a pre-charge level.

4. The circuit of claim 2, further comprising pre-charge transistors for pre-charging the electric potential of the first and second output nodes to a level of a supply voltage in response to the control signal at a pre-charge level.

5. The circuit of claim 4, further comprising a second equalization transistor connected between the first and second output nodes for equalizing the electric potential of the first and second output nodes to a substantially identical level in response to the control signal at a pre-charge level.

6. The circuit of claim 3, wherein the first and second input transistors are NMOS transistors.

7. The circuit of claim 4, wherein the first and second input transistors are NMOS transistors.

8. The circuit of claim 5, wherein the first and the second input transistors are NMOS transistors.

9. The circuit of claim 2, wherein the mismatch control transistors are PMOS transistors.

10. The circuit of claim 3, wherein the mismatch control transistors are PMOS transistors.

11. The circuit of claim 4, wherein the mismatch control transistors are PMOS transistors.

12. The circuit of claim 5, wherein the mismatch control transistors are PMOS transistors.

13. A method for compensating for a difference between two or more like transistors of a sense amplifier comprising the steps of:

equalizing the electric potential between a first node and a second node in response to non-activation of a control signal, wherein at least a first equalization transistor is connected between the first and the second nodes;

pre-charging the electric potential of a first output node and a second output node to a level of supply voltage in response to non-activation of the control signal, wherein a first pre-charge transistor and a second pre-charge transistor are implemented with the control signal input at the respective pre-charge transistor gates;

equalizing the electric potential of the first output node and the second output node in response to non-activation of the control signal, wherein at least a second equalization transistor is connected between the first and the second output nodes; and eliminating differences in voltage between the first output node and the first node, and between the second output node and the second node, in response to non-activation of the control signal, wherein mismatch control transistors are respectively connected to a drain and a source of NMOS transistors in a first and a second inverter;

wherein the first and second inverters are connected to the first and second node respectively.

14. The circuit of claim 13, further comprising the step of equalizing the electric potential of the first node and the second node in response to the control signal at a pre-charge level.

15. The circuit of claim 13, further comprising the step of pre-charging the electric potential of the first output node and the second output node to a level of a supply voltage in response to the control signal at a pre-charge level.

16. The circuit of claim 15, further comprising the step of equalizing the electric potential of the first output node and the second output node in response to the control signal at a pre-charge level.

17. The circuit of claim 13, wherein the difference is a difference in thickness of channels.

18. The circuit of claim 13, wherein the difference is a difference in length of channels.

19. The circuit of claim 13, wherein the difference is a difference in threshold.

* * * * *